United States Patent
Fujisawa et al.

(10) Patent No.: US 11,699,604 B2
(45) Date of Patent: *Jul. 11, 2023

(54) RESIN MOLDING APPARATUS (71) Applicant: APIC YAMADA CORPORATION, Nagano (JP)

(72) Inventors: Masahiko Fujisawa, Nagano (JP); Hirofumi Saito, Nagano (JP)

(73) Assignee: ABIC YAMADA CORPORATION, Nagano (JP)

( * ) Notice: Subject to any disclaimer, the term of this patent is extended or adjusted under 35 U.S.C. 154(b) by 6 days.

This patent is subject to a terminal disclaimer.

(21) Appl. No.: 17/242,323

(22) Filed: Apr. 28, 2021

(65) Prior Publication Data

US 2021/0335633 A1  Oct. 28, 2021

(30) Foreign Application Priority Data

Apr. 28, 2020 (JP) .............................. JP2020-079464

(51) Int. Cl.
*H01L 21/67* (2006.01)
*B29C 43/18* (2006.01)
*B29C 43/58* (2006.01)
*B29C 43/36* (2006.01)
*B29C 43/52* (2006.01)
(Continued)

(52) U.S. Cl.
CPC ........ *H01L 21/67126* (2013.01); *B29C 43/18* (2013.01); *B29C 43/34* (2013.01); *B29C 43/36* (2013.01); *B29C 43/52* (2013.01); *B29C 43/58* (2013.01); *B29C 2043/3405* (2013.01);
(Continued)

(58) Field of Classification Search
None
See application file for complete search history.

(56) References Cited

U.S. PATENT DOCUMENTS

| 2017/0113322 A1* | 4/2017 | Akita ................... B24B 53/062 |
| 2021/0335633 A1* | 10/2021 | Fujisawa ................ B29C 43/34 |
| 2021/0362382 A1* | 11/2021 | Fujisawa ................ B29C 43/58 |

FOREIGN PATENT DOCUMENTS

| CN | 105283289 | 1/2016 |
| JP | 2007320222 | 12/2007 |

(Continued)

OTHER PUBLICATIONS

Machine Translation of Kameyama (JP 2018022730) (Year: 2018).*

(Continued)

*Primary Examiner* — Robert J Grun
(74) *Attorney, Agent, or Firm* — JCIPRNET (57) ABSTRACT

A resin molding apparatus that can prevent a workpiece from deflecting during transfer and prevent the occurrence of molding defects due to the deflection is provided. A resin molding apparatus according to the present invention includes a molding mold that molds a workpiece on which an electronic component is mounted inside a carrier with a resin and a loader that transfers the workpiece, the loader includes a chuck that comes into contact with and separates from an outer edge part on a lower surface of the workpiece, a moving device that moves the chuck, and a frame that comes into contact with and separates from an outer edge part on an upper surface of the workpiece, and at least during transfer, the workpiece is able to be interposed between the chuck and the frame.

19 Claims, 3 Drawing Sheets (51) Int. Cl.
*B29C 43/34* (2006.01)
*B29L 31/34* (2006.01)

(52) U.S. Cl.
CPC ............... *B29C 2043/5808* (2013.01); *B29C 2043/5833* (2013.01); *B29L 2031/34* (2013.01)

(56) References Cited

FOREIGN PATENT DOCUMENTS

| JP | 6094781 | 3/2017 |
| JP | 2018022730 | 2/2018 |
| JP | 2018125356 | 8/2018 |
| TW | 201532777 | 9/2015 |
| TW | 201805137 | 2/2018 |

OTHER PUBLICATIONS

"Office Action of Taiwan Counterpart Application" with English translation thereof, dated Feb. 18, 2022, p. 1-p. 8.
"Office Action of China Counterpart Application", dated Oct. 18, 2021, with English translation thereof, p. 1-p. 9.
"Office Action of Japan Counterpart Application", dated Jan. 31, 2023, with English translation thereof, pp. 1-5.
"Office Action of China Counterpart Application" with English translation thereof, dated Nov. 3, 2022, p. 1-p. 14.

\* cited by examiner

RESIN MOLDING APPARATUS

CROSS-REFERENCE TO RELATED APPLICATIONS

This application claims the priority benefit of Japanese Patent Application No. 2020-079464, filed on Apr. 28, 2020. The entirety of the above-mentioned patent application is hereby incorporated by reference herein and made a part of this specification.

BACKGROUND

Technical Field

The present invention relates to a resin molding apparatus for molding a workpiece with a resin.

Description of Related Art

For production of semiconductor devices and the like, resin molding apparatus that mold a workpiece with an electronic component mounted on a carrier with a mold resin and process a molded product are widely used. As examples of such a resin molding apparatus, a compression molding apparatus and a transfer molding apparatus are known.

As an example of the related art, a transfer molding apparatus that molds a workpiece (lead frame) with a resin is disclosed in Patent Document 1 (Japanese Patent Application Laid-Open No. 2018-125356). In the resin molding apparatus, as the workpiece becomes larger or thinner, the amount of deflection increases due to its own weight. As a result, when the workpiece is locked to chuck claws and transferred, there are problems such as the workpiece being easily released from the chuck claws and falling. In order to solve such problems, in the resin molding apparatus described in Patent Document 1, a transfer device including a holding claw and an outer rotating holding part that can reliably hold and transfer a workpiece is provided.

PATENT DOCUMENTS

Patent Document 1: Japanese Patent Application Laid-Open No. 2018-125356

In recent years, in order to improve productivity and molding quality, there are a growing number of cases in which thinner and larger carriers than in the related art are used as carriers constituting workpieces. Therefore, when the workpiece is transferred while holding the outer circumference, the workpiece is likely to deflect (referred to as a "smile curve" in some cases), and problems may occur due to this deflection.

For example, if the workpiece in a deflected state is transferred, when a mold resin is mounted on the workpiece, the resin may be biased, which may cause molding defects. In addition, when the workpiece in a deflected state is mounted on a preheating stage and preheated, a non-uniform heating state occurs, which causes molding defects of the mold resin and a longer heating time.

SUMMARY

The present invention has been made in view of the above circumstances, and the present invention provides a resin molding apparatus that can prevent a workpiece from deflecting during transfer and prevent the occurrence of molding defects due to the deflection.

The present invention addresses the above problems according to solutions described below as embodiments.

A resin molding apparatus according to the present invention includes a molding mold that molds a workpiece on which an electronic component is mounted inside a carrier with a resin; and a loader that transfers the workpiece, wherein the loader includes a chuck that comes into contact with and separates from an outer edge part on a lower surface of the workpiece, a moving device that moves the chuck, and a frame that comes into contact with and separates from an outer edge part on an upper surface of the workpiece, and wherein, at least during transfer, the workpiece is able to be interposed between the chuck and the frame.

DESCRIPTION OF THE EMBODIMENTS

Figure 1:
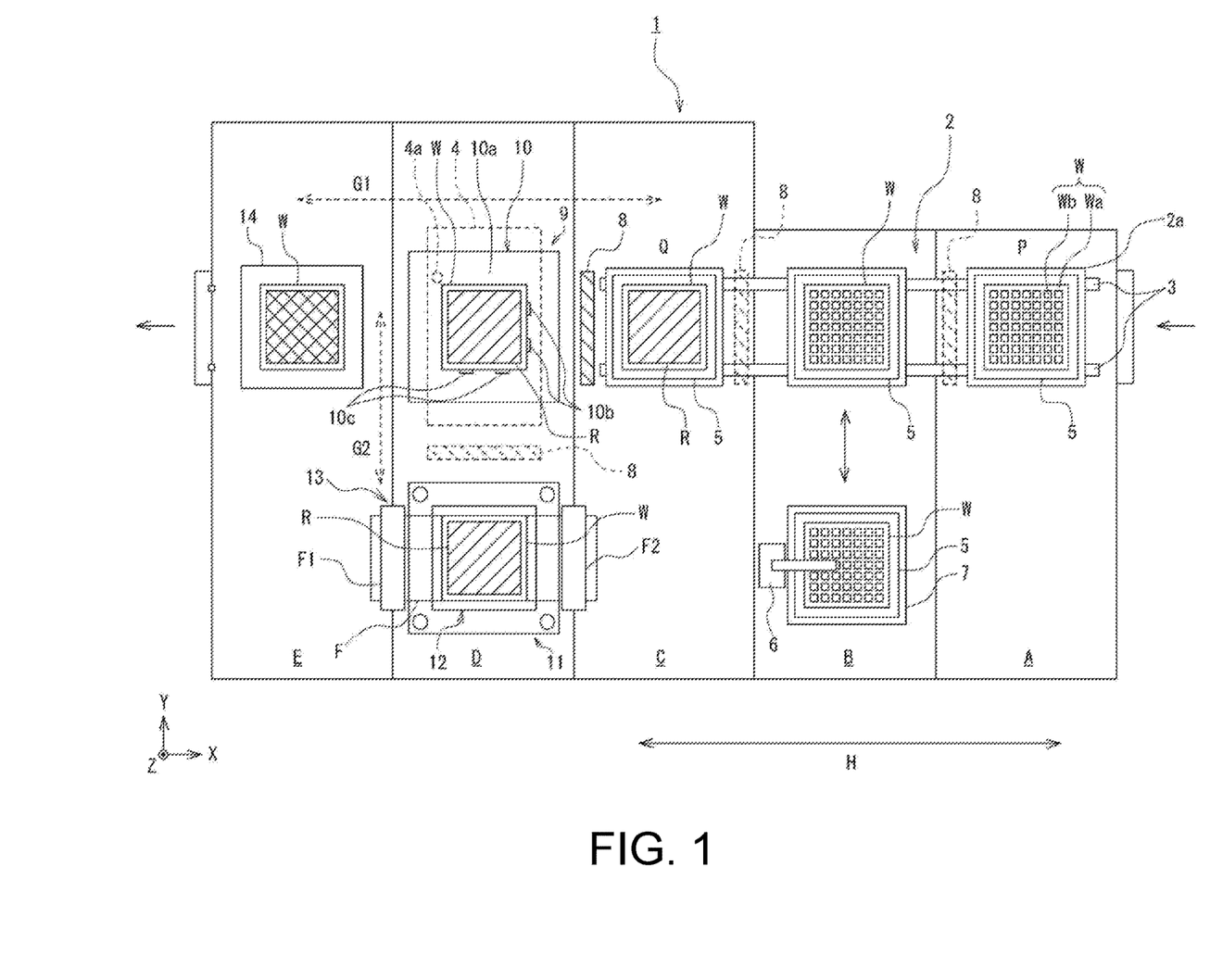
FIG. 1 is a device configuration diagram showing an example of a resin molding apparatus according to an embodiment of the present invention.

Hereinafter, embodiments of the present invention will be described in detail with reference to the drawings. FIG. 1 is a schematic view showing a configuration example of a resin molding apparatus 1 according to an embodiment of the present invention. Here, in all drawings for illustrating embodiments, members having the same function are denoted with the same reference numerals, and repeated descriptions thereof will be omitted.

The resin molding apparatus 1 according to the present embodiment is a device for performing resin mold molding of a workpiece W using a molding mold 12 including an upper mold and a lower mold. Hereinafter, a compression molding apparatus having a cavity in the upper mold will be exemplified as the resin molding apparatus 1.

First, as an example of the workpiece W to be molded, a workpiece with an electronic component Wb such as a semiconductor chip held on a carrier Wa such as a carrier plate is used. As a main example, a carrier Wa having a rectangular shape with vertical and horizontal sides of about 500 mm to 600 mm is used. For the carrier Wa, an appropriate material such as a metal (a copper alloy, a stainless steel alloy, etc.) and glass is used, but a material that is thin enough to bend under its own weight can be used. A plurality of electronic components Wb are attached in a matrix form (here, the configuration is not limited to a regularly arranged form, but widely includes a form in which a plurality of electronic components Wb are arranged in a row direction or a column direction) on such a carrier Wa using an adhesive to form a workpiece W. Here, the workpiece W is not limited to the above material and configuration. For example, the carrier Wa may be circular. In addition, for the size of the carrier Wa, the maximum width (one side or diameter) may be about 400 mm to 700 mm, and the thickness may be about 0.2 mm to 3 mm. In the present embodiment, the carrier plate and the semiconductor chip are exemplified as the carrier Wa and the electronic component Wb, but various other configurations can be used.

On the other hand, a mold resin R is, for example, a thermosetting resin (for example, a filler-containing epoxy resin), and may be in the form of granules, a powder, a liquid, a gel, or a sheet, and in some cases, may be a solid represented as a mini tablet.

Next, the outline of the resin molding apparatus 1 according to the present embodiment will be described. As shown in FIG. 1, in the resin molding apparatus 1, a workpiece supply unit A, a resin supply unit B, a workpiece delivery unit C, a pressing unit D, and a cooling unit E are linked in series. Here, the workpiece W is transferred by a workpiece transfer unit 2, a loader 4, and the like (details will be described below). Here, the units may be arranged to surround a transfer robot in the center. Hereinafter, a rectangular workpiece W will be exemplified.

In the workpiece supply unit A, a receiving position P (first position) which is a position at which the workpiece W is received from a previous process is provided. In addition, in the workpiece delivery unit C, a delivery position Q (second position) which is a position at which the workpiece W is delivered to the loader 4 is provided. Here, in the workpiece transfer unit 2, a transfer unit main body 2a reciprocates between the receiving position P and the delivery position Q along a rail part 3 provided between the workpiece supply unit A, the resin supply unit B, and the workpiece delivery unit C (refer to the solid arrow H in FIG. 1). As an example, the transfer unit main body 2a is linked to, for example, a drive belt (not shown) and reciprocates. In addition, on the transfer unit main body 2a, a holder plate 5 having a rectangular plate surface (may have a grid shape or the like) which has a larger outer shape and a thicker thickness (for example, about 10 mm) than the workpiece W is provided. With such a configuration of the workpiece transfer unit 2, the workpiece W that is positioned with respect to and mounted on the holder plate 5 is transferred. Therefore, even if a workpiece W that is thinner and larger than a conventional workpiece is used, since it is transferred while it is mounted on the holder plate 5, it is possible to prevent the workpiece W from deflecting.

Next, in the resin supply unit B, a dispenser 6 and a resin supply stage 7 for supplying the mold resin R (as an example, a granular resin) are provided. The workpiece W that is mounted on the holder plate 5 is transferred from the transfer unit main body 2a to the resin supply stage 7 using a pick and place mechanism (not shown) that can move in the Y-Z direction. While it is mounted on the resin supply stage 7, the mold resin R is supplied onto the workpiece W from the dispenser 6. Here, the dispenser 6 is provided so that scanning is possible in the X-Y direction on the workpiece W. In addition, an electronic balance (not shown) is provided on the resin supply stage 7, and performs weighing so that the amount of the mold resin R supplied onto the workpiece W is appropriate.

Next, in the workpiece delivery unit C, the delivery position Q which is a position at which the workpiece W to which the mold resin R is supplied is delivered from the holder plate 5 to the loader 4 is provided. In the loader 4, a mechanism for holding the workpiece W (details will be described below) is provided. With such a configuration of the loader 4, the workpiece W is held at the delivery position Q and is transferred to a preheating unit 9 of the pressing unit D without supporting the inside of the lower surface of the workpiece W. Here, a range in which the loader 4 moves in the X-Y direction is indicated by dashed arrows G1 and G2 in FIG. 1.

In addition, in the workpiece delivery unit C, a cleaning device 8 for removing dust such as resin powder and foreign substances adhered to a predetermined surface of the workpiece W is provided. The cleaning device 8 according to the present embodiment is configured to clean, when the workpiece W held by the loader 4 is transferred from the delivery position Q to the pressing unit D (the preheating unit 9), its lower surface (here, the surface on which no electronic component Wb is mounted). Here, as a modification example, as indicated by the dashed line in FIG. 1, the cleaning device 8 may be provided at a plurality of positions.

Next, the pressing unit D, the preheating unit 9 and a pressing part 11 are provided. In the preheating unit 9, a preheater 10 is provided. The preheater 10 preheats the workpiece W to which the mold resin R is supplied and which is mounted on a preheating stage 10a to a predetermined temperature (as an example, about 100° C.). The workpiece W preheated to a predetermined temperature by the preheating unit 9 (the preheater 10) is held by the loader 4 and loaded on the pressing part 11 (the molding mold 12).

In the preheating unit 9, a pair of an X direction reference block 10b and a Y direction reference block 10c for correcting positional displacement of the workpiece W in the rotation direction are provided. Accordingly, when the workpiece W is pushed against the pair of the X direction reference block 10b and the Y direction reference block 10c with a pusher (not shown) or the like on the preheating stage 10a, it is possible to correct the positional displacement of the workpiece W in the rotation direction.

Here, in the loader 4, an imaging camera 4a for reading the coordinates of corners of the workpiece W is provided. Accordingly, it is possible to correct the position at which the workpiece W is held by the loader 4. The reason for performing this correction is that, since each workpiece W has a dimensional tolerance of about ±1 mm, and also the workpiece W is stretched when the workpiece W is preheated to a predetermined temperature on the preheating stage 10a, it is necessary to correct the position at which the workpiece W is held by the loader 4 before it is loaded in the molding mold 12.

As a specific correction method, the amount of displacement between the work center position and the stage center position is detected from the amount of positional displacement between the outer shape position of the workpiece W and the alignment mark. For example, the coordinates of the corners of the workpiece W are read by the imaging camera 4a provided in the loader 4 to calculate the amount of displacement from the alignment mark in the X-Y directions, and the workpiece W is held after aligning the center position of the loader 4 and the center position of the workpiece W. The present embodiment has a configuration in which one imaging camera 4a is provided in the loader 4, but the present invention is not limited thereto, and a configuration in which a plurality of imaging cameras 4a are provided to read the coordinates of the workpiece W may be used.

On the other hand, in the pressing part 11, the molding mold 12 having an upper mold and a lower mold is provided. The present embodiment has a configuration in which a mounting part of the workpiece W is provided in the lower mold and the cavity is provided in the upper mold. A configuration in which, after the workpiece W on which the mold resin R is mounted is loaded into the molding mold 12 configured in this manner, the mold is closed, and heated to, for example, about 130° C. to 150° C., and resin molding (compression molding) is performed is used. Here, as an example, the lower mold is a movable type and the upper mold is a fixed type, but the present invention is not limited thereto, and the lower mold may be a fixed type and the upper mold may be a movable type, or both molds may be a movable type. In addition, the molding mold 12 is opened and closed by a known mold opening and closing mechanism (not shown). As an example of the mold opening and closing mechanism, a configuration including a pair of platens, a plurality of linking mechanisms (tie-bars and pillars) in which a pair of platens are installed, a drive source that moves (elevates) the platens (for example, an electric motor) and a drive transmission mechanism (for example, a toggle link) is known (not shown in the drawing).

In addition, in the pressing part 11, a film transfer mechanism 13 for supplying (transferring) a release film F to the molding mold 12 (here, an upper mold) is provided. The film transfer mechanism 13 is provided to attract and hold the release film F on the upper mold clamp surface including the cavity. Here, for the release film F, a film material which is connected in an elongated shape and which has excellent heat resistance, ease of peeling off, flexibility, and extensibility is used, and for example, polytetrafluoroethylene (PTFE), a polytetrafluoroethylene polymer (ETFE), PET, FEP, fluorine impregnated glass cloth, polypropylene, polyvinylidene chloride, and the like are suitably used. The release film F is fed from a feeding roller F1 and is supplied (transferred) so that it is wound on a winding roller F2 via the upper mold clamp surface. Here, a configuration in which a strip-shaped film cut to a required size corresponding to the workpiece W is used in place of the elongated film may be used.

Next, in the cooling unit E, a cooling stage 14 for cooling the workpiece W removed from the molding mold 12 is provided. As an operation example, when the resin molding operation is completed and the molding mold 12 is opened, the loader 4 enters the molding mold 12 and holds and removes the workpiece W. The workpiece W that is held by the loader 4 is transferred from the pressing unit D to the cooling unit E and delivered to the cooling stage 14, and cooled. Here, the cooled workpiece W is transferred to a subsequent process (a dicing process, etc.).

Next, the configuration of the characteristic loader 4 in the present embodiment will be described in detail.

Figure 2:
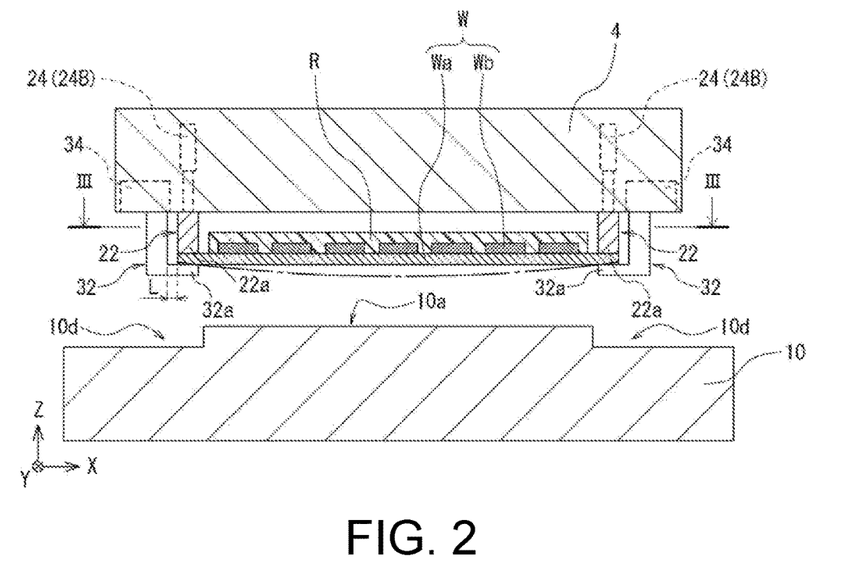
FIG. 2 is a schematic view (front cross-sectional view) showing an example of a loader and a preheater of the resin molding apparatus in FIG. 1.

As shown in FIG. 2, the loader 4 includes a frame 22 that comes into contact with and separates from an outer edge part on the upper surface of the workpiece W (here, the surface on which the electronic component Wb is mounted) and a first moving device 24 that moves the frame 22 up and down. In addition, a chuck 32 that comes into contact with and separates from the outer edge part on the lower surface of the workpiece W (here, the surface on which no electronic component Wb is mounted) and a second moving device 34 that moves the chuck 32 are provided. At the tip of the chuck 32, a plurality of chuck claws 32a that come into contact with the lower surface of the workpiece W are provided. The workpiece W can be interposed between the frame 22 and the chuck 32 in the vertical direction (Z-axis direction). That is, in a plan view, the frame 22 and the chuck 32 are arranged in an overlapping manner. Here, the loader 4 and a control unit (not shown) configured to control movement of the first moving device 24 and the second moving device 34 are provided at predetermined positions on the resin molding apparatus 1.

The first moving device 24 according to the present embodiment includes a guide post 24A that guides vertical movement (movement in the Z-axis direction) of the frame 22 and a cylinder 24B which is a drive mechanism that drives vertical movement (movement in the Z-axis direction). Here, the cylinder 24B is connected to an electro-pneumatic regulator (not shown) controlled by the control unit and is operated. In addition, the frame 22 may be moved up and down by a combination of a servomotor, a linear guide, and the like. Accordingly, the operation (a pressing force, a pressing speed, etc.) of the cylinder 24B can be variably controlled.

Figure 3:
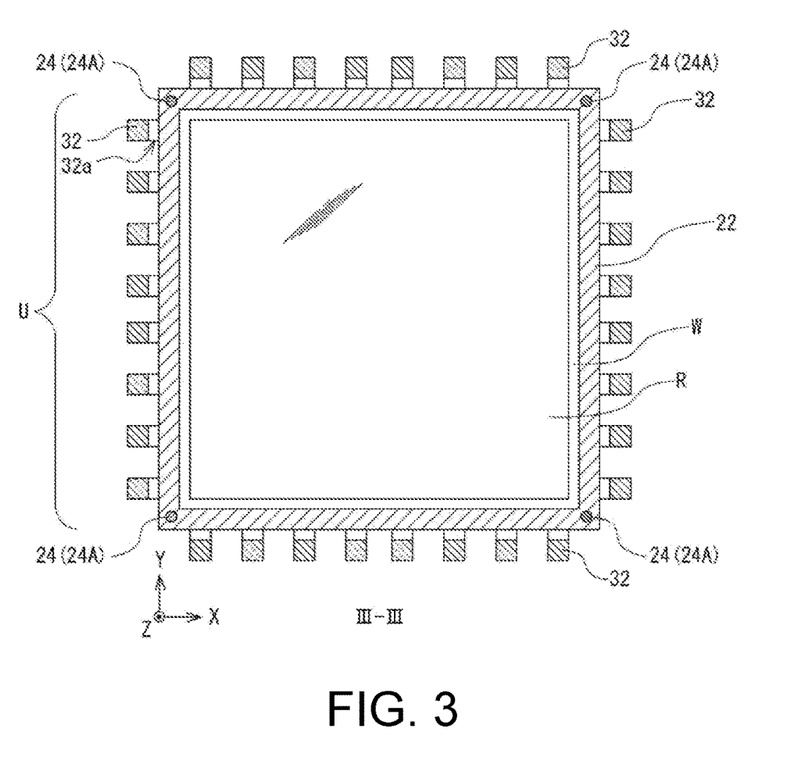
FIG. 3 is a cross-sectional view along the line III-III in FIG. 2.
Figure 4:
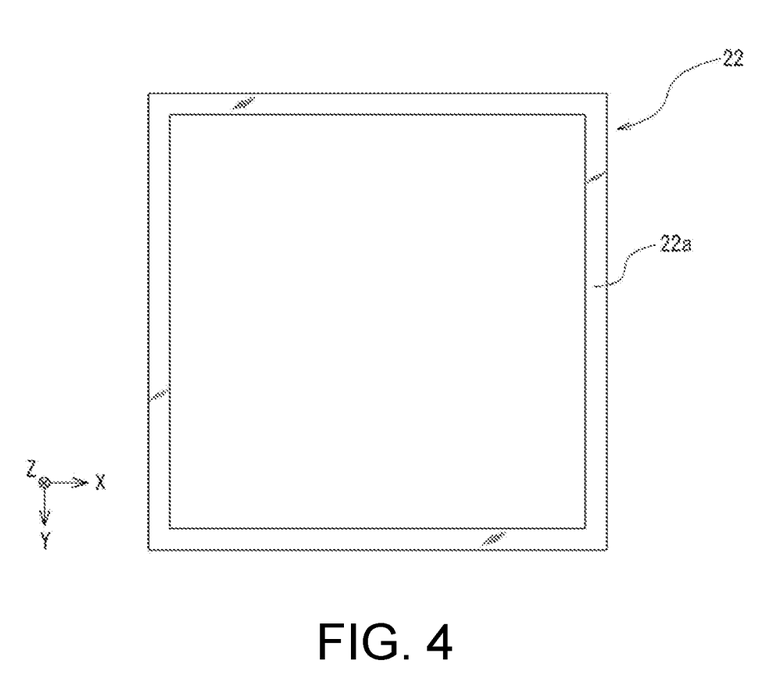
FIG. 4 is a schematic view (bottom view) showing an example of a frame of the resin molding apparatus in FIG. 1.

Next, the frame 22 according to the present embodiment includes a contact part 22a that is provided over the entire circumference of the outer edge part of the workpiece W. As an example of the contact part 22a, as shown in FIG. 2 to FIG. 4, a continuous annular shape (a cornered circular shape corresponding to the rectangular workpiece W) in a plan view (bottom view) is formed. However, the contact part 22a is not limited to this configuration, and may be formed in a discontinuous shape (intermittent shape) (not shown). Here, in FIG. 2, in order to easily understand the configuration, the chuck claw 32a on the back side is not shown.

In order to prevent the mold resin R from scattering, the frame 22 preferably has an annular shape that is continuous over the entire circumference, but it may have an arbitrary intermittent configuration in consideration of engagement of the chuck 32 (in particular, the chuck claw 32a). Specifically, a configuration in which the frame 22 is continuous on sides and discontinuous at corners with respect to the rectangular workpiece W may be used. In addition, a configuration in which the frame 22 is discontinuous at a predetermined position such as the center of each side with respect to the rectangular workpiece W may be used. However, in this case, the carrier Wa can be interposed without being distorted by preventing the position of the chuck claw 32a and the discontinuous position from overlapping. Here, when the frame 22 has an intermittent configuration, it is possible to make an inexpensive configuration by arbitrarily combining small parts such as a member of a corner portion and a member of a side portion.

In addition, when the carrier Wa is circular, the inner circumference of the frame 22 also needs to be circular, but in this case, it may have an annular shape that is continuous over the entire circumference, or it may be discontinuous midway. In this case, it is possible to combine small parts by forming configurations that are discontinuous at certain intervals.

In addition, in the frame 22, at least the contact part 22a is preferably formed using an electrostatic discharge (ESD) material having a heat resistant temperature of about 250° C. This ESD material releases, prevents, or alleviates the charged state generated by peel charging or triboelectric charging with another member (for example, the carrier Wa) with which the frame 22 comes into contact. Accordingly, it is possible to prevent generation of static electricity in the frame 22 and prevent the mold resin R mounted on the workpiece W from adhering to the frame 22. Therefore, the frame 22 can also be formed using an ESD material on the inner peripheral surface and the lower surface. Here, in the contact part 22a, an elastic component, for example, rubber, may be used for holding and protecting the carrier Wa to be described below.

According to the above configuration, when the workpiece W is transferred onto the preheater 10 from the delivery position Q and when it is transferred from above the preheater 10 into the molding mold 12, the workpiece W with the outer edge part interposed between the frame 22 and the chuck 32 can be transferred. Therefore, even if the workpiece W that is thinner and larger than a conventional workpiece is used, since it is transferred with the outer edge part interposed, it is possible to prevent the workpiece W from deflecting due to its own weight or the weight of the mold resin R. As a result, it is possible to prevent the occurrence of molding defects due to bias of the mold resin R caused by deflection. For example, when only the outer edge part of the outer circumference of the workpiece W is supported with only the chuck claw 32a of the chuck 32, as indicated by the dashed line in FIG. 2, it is attracted inward by its own weight or the like and a force is applied so that the center of the workpiece W (the carrier Wa) is deflected downward. However, when the loader 4 receives the workpiece W, if the outer edge part of the carrier Wa placed flat is interposed between the chuck 32 and the frame 22, it is possible to prevent the workpiece W from deflecting even if a force with which the carrier Wa is pulled inward is applied due to the weight of the workpiece W and the weight of the mold resin R. In addition, when the first moving device 24 is controlled and control is performed so that the contact part 22a of the frame 22 is pressed against the carrier Wa with a pressing force in a range in which no breakdown (breakage and pressure loss) occurs in the carrier Wa, it is possible to prevent the workpiece W from deflecting while protecting the carrier Wa. In this manner, when the pressing force of the frame 22 is controlled, transfer can be performed while preventing breakdown (breakage) of the workpiece W, preventing the workpiece W from falling, and preventing deflection.

Here, the control unit performs the following control. Specifically, control is performed so that the frame 22 comes into contact with the upper surface of the workpiece W when the loader 4 moves the workpiece W to which the mold resin R is supplied from the delivery position Q to the preheating stage 10a.

According to the above configuration, since the contact part 22a of the frame 22 is formed in a continuous annular shape in a plan view (bottom view), when the workpiece W with the upper surface (here, the surface on which the electronic component Wb is mounted) to which the mold resin R is supplied by the dispenser 6 is transferred using the loader 4, a function of preventing the atmosphere from passing over the moving workpiece W is obtained.

Accordingly, since it is possible to prevent the mold resin R from blowing up and scattering, it is possible to prevent generation of particles (dust) floating in the resin molding apparatus 1. Therefore, it is possible to prevent the occurrence of molding defects due to the particles.

In addition, the control unit performs the following control. Specifically, on the preheating stage 10a, the pressing force and the pressing speed when the frame 22 comes into contact with the workpiece W can be controlled (here, one of them can be controlled).

Next, the chucks 32 according to the present embodiment are arranged in an annular shape in a plan view, and come in contact with and support the outer edge part of the workpiece W at multiple positions at certain intervals in the direction along the side of the workpiece W. Specifically, (8) chuck claws 32a that support 8 points per side are provided at equal intervals corresponding to the rectangular workpiece W. For example, when two points per side, which is the minimum number for stable holding on two sides, are supported, in a large workpiece whose sides exceed 400 mm, it is conceivable that the distance between supporting points exceeds 100 mm, and it is conceivable that the workpiece W deflects between supporting points. In the configuration of the present invention, when such deflection occurs in the workpiece W, there are problems that the carrier Wa is separated from the frame 22, and the mold resin R on the workpiece W falls out through the gap.

On the other hand, according to the above configuration, as shown in FIG. 3, by supporting with 8 chuck claws 32a per side, it is possible to prevent such a gap from being generated. However, the present invention may be applied to a case other than supporting with 8 chuck claws 32a per side. Regarding a minimum limit for preventing the carrier Wa from being separated from the frame 22, it is necessary to provide a total of three or more chuck claws 32a including two points at both ends on one side and one point in the middle. Here, the number of chuck claws 32a can be arbitrarily set according to the length of one side of the carrier Wa, its material, its thickness, the weight of the electronic component on the carrier Wa and the mold resin R, their arrangement, a force with which the contact part 22a is pressed against the carrier Wa, an area in which the carrier Wa is interposed between the chuck claw 32a and the frame 22, and the like. With such a configuration, it is possible to prevent the workpiece W from deflecting between the chuck claws 32a adjacent to each other. Here, as an example, in the configuration in FIG. 3, the width size of the chuck claw 32a in a plan view is set to about 20 mm.

In addition, in the chuck 32 according to the present embodiment, a plurality of chuck claws 32a provided on one side (as an example, the side U in FIG. 3) are integrally formed on the rear end side (the side opposite to the workpiece W). Therefore, the chuck claw 32a can integrally enter and retract with respect to the projection surface of the workpiece W in a plan view. Therefore, a mechanism for moving the chuck claw 32a (the second moving device 34 to be described below) can be simply formed. In addition, it is possible to uniformly clamp the position of the chuck claw 32a at the same height.

Here, the second moving device 34 according to the present embodiment allows the chucks 32 to be located at positions at which the chucks 32 (here, the chuck claws 32a) enter a projection surface of the workpiece W in a plan view which are positions close to each other with a predetermined gap (in FIG. 2, L=about 1.7 mm) so that they do not come into contact with a lateral outer circumferential part of the workpiece W or at positions outside the projection surface of the workpiece W in a plan view. Specifically, it has a configuration including a drive mechanism (for example, a cylinder, etc.) for driving the chuck claw 32a to move horizontally (move in the X-Y direction) (not shown). However, the present invention is not limited to the configuration, and a configuration including a rotating shaft (not shown) for rotationally moving the chuck claw 32a, a configuration in which horizontal movement and rotation movement are combined for movement, and the like are conceivable.

In this manner, according to the configuration in which the chuck 32 (the chuck claw 32a) is movable, the workpiece W at the delivery position Q and mounted on the preheater 10 can be held by the loader 4. In addition, according to the configuration for causing the components to approach each other without the chuck 32 (the chuck claw 32a) coming into contact with the lateral outer circumferential part of the workpiece W, it is possible to correct the position at which the workpiece W is held by the loader 4.

Here, as described above, when the workpiece W is transferred onto the preheater 10 from the delivery position Q and when the workpiece W is transferred from above the preheater 10 into the molding mold 12 (here, onto the lower mold), the workpiece W with the outer edge part interposed between the frame 22 and the chuck 32 is transferred.

Therefore, in the preheating stage 10a and the molding mold 12 (lower mold), while the lower surface (here, the surface on which no electronic component Wb is mounted) of the workpiece W is in contact with a predetermined mounting surface, a retraction groove 10d in which the chuck 32 (the chuck claw 32a) enters and is retracted is provided at a corresponding position (in a plan view, a position directly below the chuck claw 32a). Here, although not shown, the retraction groove 10d in which the chuck 32 (the chuck claw 32a) enters and retracts is also provided in the lower mold. Accordingly, the workpiece W can be mounted in contact with the preheating stage 10a and the molding mold 12 (lower mold).

In addition, as described above, the outer diameter size of the workpiece W which is a target of the resin mold is not one type. Therefore, the frame 22 and the chuck 32 are prepared as a plurality of types of assemblies corresponding to a plurality of types of workpieces W having different outer diameter sizes. In addition, the loader 4 can attach/detach and operate each assembly. Accordingly, with one resin molding apparatus according to the present embodiment, it is possible to perform resin molding on a plurality of types of workpieces W having different outer diameter sizes.

As described above, according to the resin molding apparatus of the present invention, it is possible to correct deflection of the workpiece during preheating or the like. Therefore, it is possible to improve the production efficiency and prevent the occurrence of molding defects.

Here, the present invention is not limited to the examples described above, and various modifications can be made without departing from the spirit and scope of the present invention. In particular, a configuration in which a plurality of semiconductor chips are mounted in a matrix form on a rectangular carrier as a workpiece has been exemplified, but the present invention is not limited thereto. For example, similarly, resin molding can be performed on a workpiece using another member in place of the carrier as a member on which mounting is performed or a workpiece using another element in place of a semiconductor chip as the mounting member. In addition, as the workpiece is larger, deflection is more likely to occur, but the configuration of the present invention can be applied to a workpiece smaller than that on an extremely thin substrate, and need not necessarily be applied to a large workpiece having one side of 500 mm.

In addition, while the compression molding type resin molding apparatus including the cavity in the upper mold has been exemplified, application to a configuration in which only the lower mold has a cavity and application to a transfer molding type are possible.

It will be apparent to those skilled in the art that various modifications and variations can be made to the disclosed embodiments without departing from the scope or spirit of the present invention. In view of the foregoing, it is intended that the present invention covers modifications and variations provided that they fall within the scope of the following claims and their equivalents.

A resin molding apparatus according to the present invention includes a molding mold that molds a workpiece on which an electronic component is mounted inside a carrier with a resin; and a loader that transfers the workpiece, wherein the loader includes a chuck that comes into contact with and separates from an outer edge part on a lower surface of the workpiece, a moving device that moves the chuck, and a frame that comes into contact with and separates from an outer edge part on an upper surface of the workpiece, and wherein, at least during transfer, the workpiece is able to be interposed between the chuck and the frame.

Accordingly, when the workpiece is transferred by the loader, it is possible to transfer the workpiece with the outer edge part interposed between the frame and the chuck. Therefore, even if a workpiece that is thinner and larger than a conventional workpiece is used, since the workpiece is transferred with the outer edge part interposed, it is possible to prevent the workpiece from deflecting.

In addition, preferably, the resin molding apparatus further includes a control unit configured to control movement of the frame, and the control unit controls a pressing force when the frame comes into contact with the workpiece. Accordingly, it is possible to transfer the workpiece while preventing breakdown (breakage) of the workpiece, preventing the workpiece from falling, and preventing deflection.

In addition, preferably, the chuck provides support through contact with the outer edge part of the workpiece at multiple positions at intervals. Accordingly, it is possible to prevent the workpiece from deflecting between support points.

Preferably, in the chuck, a plurality of chuck claws provided on one side are integrally formed on a rear end side, and the chuck claws are able to integrally enter and retract with respect to a projection surface of the workpiece in a plan view. Accordingly, it is possible to simply form a mechanism for moving chuck claws.

In addition, preferably, the moving device performs horizontal movement, rotation movement, or combination movement thereof so that the chucks are located at positions at which the chucks enter a projection surface of the workpiece in a plan view which are positions close to each other with a predetermined gap so that they do not come into contact with a lateral outer circumferential part of the workpiece or located at positions outside the projection surface of the workpiece in a plan view. Accordingly, according to the configuration in which the chuck is movable, the workpiece at the delivery position and mounted on the preheater or the like can be held by the loader. In addition, according to the configuration for causing the components to approach each other without the chuck coming into contact with the lateral outer circumferential part of the workpiece, it is possible to correct the position at which the workpiece is held by the loader.

In addition, preferably, the resin molding apparatus further includes a preheating stage that preheats the workpiece, wherein the preheating stage has a retraction groove in which the chuck is retracted while the lower surface of the workpiece is brought into contact therewith. Accordingly, the workpiece can be mounted in contact with the preheating stage and the molding mold.

In addition, preferably, the chucks are arranged in an annular shape in a plan view. Accordingly, the workpiece can be reliably interposed between the chuck and the frame over the entire circumference of the outer edge part of the workpiece.

In addition, preferably, the chuck and the frame are provided as a plurality of types of assemblies corresponding to a plurality of types of workpieces having different outer diameters, and the loader is able to attach/detach and operate the assemblies. Accordingly, it is possible to perform resin molding on a plurality of types of workpieces W having different outer diameter sizes by simply replacing them with a corresponding assembly.

As an example, the carrier is formed in a shape having a thickness of 0.2 mm to 3 mm and a maximum width of 400 mm to 700 mm. Accordingly, the present invention exhibits particularly significant effects on a workpiece having a carrier thinner and larger than a conventional workpiece.

According to the present invention, it is possible to prevent the workpiece from deflecting during transfer. Therefore, it is possible to prevent the occurrence of molding defects due to deflection of the workpiece.

What is claimed is:

1. A resin molding apparatus, comprising:
  a molding mold that molds a workpiece on which an electronic component is mounted inside a carrier with a resin; and
  a loader that transfers the workpiece,
  wherein the loader comprises a chuck that comes into contact with and separates from an outer edge part on a lower surface of the workpiece, a moving device that moves the chuck, and a frame that comes into contact with and separates from an outer edge part on an upper surface of the workpiece, and
  wherein, at least during transfer, the workpiece is able to be interposed between the chuck and the frame,
  the chuck and the fame are provided as a plurality of types of assemblies corresponding to a plurality of types of workpieces having different outer diameters, and
  the loader is able to attach/detach and operate the assemblies.

2. The resin molding apparatus according to claim 1, further comprising
  a control unit configured to control movement of the frame,
  wherein the control unit controls a pressing force when the frame comes into contact with the workpiece.

3. The resin molding apparatus according to claim 2, wherein the moving device performs horizontal movement, rotation movement, or combination movement thereof so that the chucks are located at positions at which the chucks enter a projection surface of the workpiece in a plan view which are positions close to each other with a predetermined gap so that they do not come into contact with a lateral outer circumferential part of the workpiece or located at positions outside the projection surface of the workpiece in a plan view.

4. The resin molding apparatus according to claim 2, further comprising
  a preheating stage that preheats the workpiece,
  wherein the preheating stage has a retraction groove in which the chuck is retracted while the lower surface of the workpiece is brought into contact therewith.

5. The resin molding apparatus according to claim 2, wherein the chucks are arranged in an annular shape in a plan view.

6. The resin molding apparatus according to claim 1, wherein the chuck provides support through contact with the outer edge part of the workpiece at multiple positions at intervals.

7. The resin molding apparatus according to claim 6, wherein, in the chuck, a plurality of chuck claws provided on one side are integrally formed on a rear end side, and the chuck claws are able to integrally enter and retract with respect to a projection surface of the workpiece in a plan view.

8. The resin molding apparatus according to claim 7, wherein the moving device performs horizontal movement, rotation movement, or combination movement thereof so that the chucks are located at positions at which the chucks enter a projection surface of the workpiece in a plan view which are positions close to each other with a predetermined gap so that they do not come into contact with a lateral outer circumferential part of the workpiece or located at positions outside the projection surface of the workpiece in a plan view.

9. The resin molding apparatus according to claim 7, further comprising
  a preheating stage that preheats the workpiece,
  wherein the preheating stage has a retraction groove in which the chuck is retracted while the lower surface of the workpiece is brought into contact therewith.

10. The resin molding apparatus according to claim 7, wherein the chucks are arranged in an annular shape in a plan view.

11. The resin molding apparatus according to claim 6, wherein the moving device performs horizontal movement, rotation movement, or combination movement thereof so that the chucks are located at positions at which the chucks enter a projection surface of the workpiece in a plan view which are positions close to each other with a predetermined gap so that they do not come into contact with a lateral outer circumferential part of the workpiece or located at positions outside the projection surface of the workpiece in a plan view.

12. The resin molding apparatus according to claim 6, further comprising
  a preheating stage that preheats the workpiece,
  wherein the preheating stage has a retraction groove in which the chuck is retracted while the lower surface of the workpiece is brought into contact therewith.

13. The resin molding apparatus according to claim 6, wherein the chucks are arranged in an annular shape in a plan view.

14. The resin molding apparatus according to claim 1, wherein the moving device performs horizontal movement, rotation movement, or combination movement thereof so that the chucks are located at positions at which the chucks enter a projection surface of the workpiece in a plan view which are positions close to each other with a predetermined gap so that they do not come into contact with a lateral outer circumferential part of the workpiece or located at positions outside the projection surface of the workpiece in a plan view.

15. The resin molding apparatus according to claim 14, further comprising
  a preheating stage that preheats the workpiece,
  wherein the preheating stage has a retraction groove in which the chuck is retracted while the lower surface of the workpiece is brought into contact therewith.

16. The resin molding apparatus according to claim 14, wherein the chucks are arranged in an annular shape in a plan view.

17. The resin molding apparatus according to claim 1, further comprising
  a preheating stage that preheats the workpiece,
  wherein the preheating stage has a retraction groove in which the chuck is retracted while the lower surface of the workpiece is brought into contact therewith.

18. The resin molding apparatus according to claim 17, wherein the chucks are arranged in an annular shape in a plan view.

19. The resin molding apparatus according to claim 1, wherein the chucks are arranged in an annular shape in a plan view.

* * * * *